United States Patent
Stark et al.

(10) Patent No.: US 6,194,651 B1
(45) Date of Patent: Feb. 27, 2001

(54) ELECTROSTATIC DISCHARGE FOR SOLAR CELL

(75) Inventors: Joachim Stark, Oberteuringen; Dieter Altstaedter, Markdorf, both of (DE)

(73) Assignee: Dornier GmbH, Friedrichshafen (DE)

( * ) Notice: Subject to any disclaimer, the term of this patent is extended or adjusted under 35 U.S.C. 154(b) by 0 days.

(21) Appl. No.: 09/381,689

(22) PCT Filed: Dec. 5, 1998

(86) PCT No.: PCT/DE98/03574

§ 371 Date: Dec. 27, 1999

§ 102(e) Date: Dec. 27, 1999

(87) PCT Pub. No.: WO99/38217

PCT Pub. Date: Jul. 29, 1999

(30) Foreign Application Priority Data

Jan. 23, 1998 (DE) .............................. 198 02 325

(51) Int. Cl.[7] .................. H01L 31/048; H01L 31/068
(52) U.S. Cl. .................. 136/256; 136/244; 136/251; 136/259; 136/292; 136/293; 136/290; 257/461; 257/433; 257/434
(58) Field of Search .................. 136/244, 251, 136/256, 259, 292, 293, 290; 257/461, 433, 434

(56) References Cited

U.S. PATENT DOCUMENTS 4,832,755 * 5/1989 Barton et al. .................. 136/292
4,915,743 * 4/1990 Schilling .................. 136/256
5,542,988 * 8/1996 Bogus .................. 136/244

FOREIGN PATENT DOCUMENTS

| 36 06 464 | 9/1987 | (DE) . |
| 37 33 645 | 4/1989 | (DE) . |
| WO 94/19831 | 9/1994 | (WO) . |
| WO 99/59210 | * 11/1999 | (WO) . |

OTHER PUBLICATIONS

Japanese Patent Abstract No. 60–189272, vol. 010, No. 032 [E–379], Feb. 7, 1986.

*Institute of Electrical and Electronics Engineers*, Dec. 5–9, 1994, pp. 2058–2061 entitled "Teflon Bonding of Solar Cell Assemblies Using Pilkington CMZ & CMG Coverglasses—Now a Production Process" by Kitchen et al.

* cited by examiner

*Primary Examiner*—Alan Diamond
(74) *Attorney, Agent, or Firm*—Evenson, McKeown, Edwards & Lenahan, PLLC

(57) ABSTRACT

Electrostatic discharge (ESD) protection arrangement for a solar cell assembly (SCA) is suitable for the use as a component of orbiting solar generators. The SCA is constructed of a cover glass provided with a conductive vapor deposit, a bonding layer and a solar cell. At least a portion of a side face of the SCA is provided with a conductive layer which conductively connects the conductive layer on the cover glass and the solar cell.

7 Claims, 2 Drawing Sheets p-n TRANSITION SHORT CIRCUITED BY CONDUCTIVE LAYER

ELECTROSTATIC DISCHARGE FOR SOLAR CELL

BACKGROUND AND SUMMARY OF THE INVENTION

This application is a U.S. National Stage Application under 35 U.S.C. §371 based upon PCT/DE 98/03574 filed Dec. 5, 1998, the disclosure of which is expressly incorporated by reference herein.

The invention relates to an electrostatic discharge (ESD) protection arrangement for a solar cell assembly (SCA), particularly for the use as a component of orbiting solar generators. The SCA is constructed of a cover glass provided with a conductive vapor deposit, a bonding layer and a solar cell.

German Patent Document DE 36 06 464 A1 discloses a device for preventing a static charge on solar generators in which the surface and the side faces of the cover glass and the bonding layer are electrically conductive.

ESD protection is necessary in order to avoid charging of the cover glasses of the solar cells (silicium or gallium arsenide) to an unacceptably high potential during orbit. Unacceptably high charge potentials can destroy sensitive electronic components on the satellite, and can even cause a failure of the entire solar generator.

Two different methods have been developed for ESD protection, and have been qualified for applications in space operations. The two methods have in common that they require high expenditures and have a limited potential for conversion to a reproducible, simple and mainly inexpensive series production. These are as follows:

Protection in the CLUSTER Satellite Project

Because of its cylindrical shape, in the CLUSTER solar generator, the conductive cover glasses are jointly contacted and grounded by means of spiral wires. This principle was found to be successful but has several disadvantages:

- It can be used only in cylindrical generator surfaces up to a certain radius of curvature;
- it is successful only at a low satellite spin rate;
- it makes the cell repairs which may be necessary after mounting more difficult and more expensive, because the applied spiral wires must be removed and cannot be reused.

Protection Used in the XMM Satellite Project

In this approach, the spaces between the cells are provided with so-called bonding agent crosses, and subsequently small silver plates are applied by means of conductive bonding agents. This results in a connection of all conductive cover glasses which are grounded jointly without, however, having any contact with the individual solar cells.

The following disadvantages were found:

- High labor expenditures. Several thousand bonding agent crosses must be applied manually by means of an injector;
- after the manufacturing, an expensive cleaning process is required for removing disturbing bonding agent residue;
- manufacturing tolerances, which cannot be excluded, may result in short circuits which require considerable reworking.

It is an object of the invention to provide a secure arrangement for discharging the electrostatic charge of solar cells in applications in space operations, so that disturbances on the solar cells and panels are avoided and a discharge-free environment is created for the highly sensitive instruments on a satellite.

This and other objects and advantages are achieved by the ESD protection arrangement according to the invention for a solar cell assembly which has a cover glass with a conductive vapor deposit, a bonding layer and a solar cell. According to the invention, at least a portion of the side face of the solar cell array has a conductive layer or strip which connects the conductive layer on the cover glass and the solar cell.

It is the concept of the invention that the forming charge potential on the cover glasses is not, as in the prior art, discharged by means of an entire conductive surface layer; rather, the cover glass of each cell is grounded individually onto the solar cell itself.

Other objects, advantages and novel features of the present invention will become apparent from the following detailed description of the invention when considered in conjunction with the accompanying drawings.

DETAILED DESCRIPTION OF THE DRAWINGS

Figure 1:
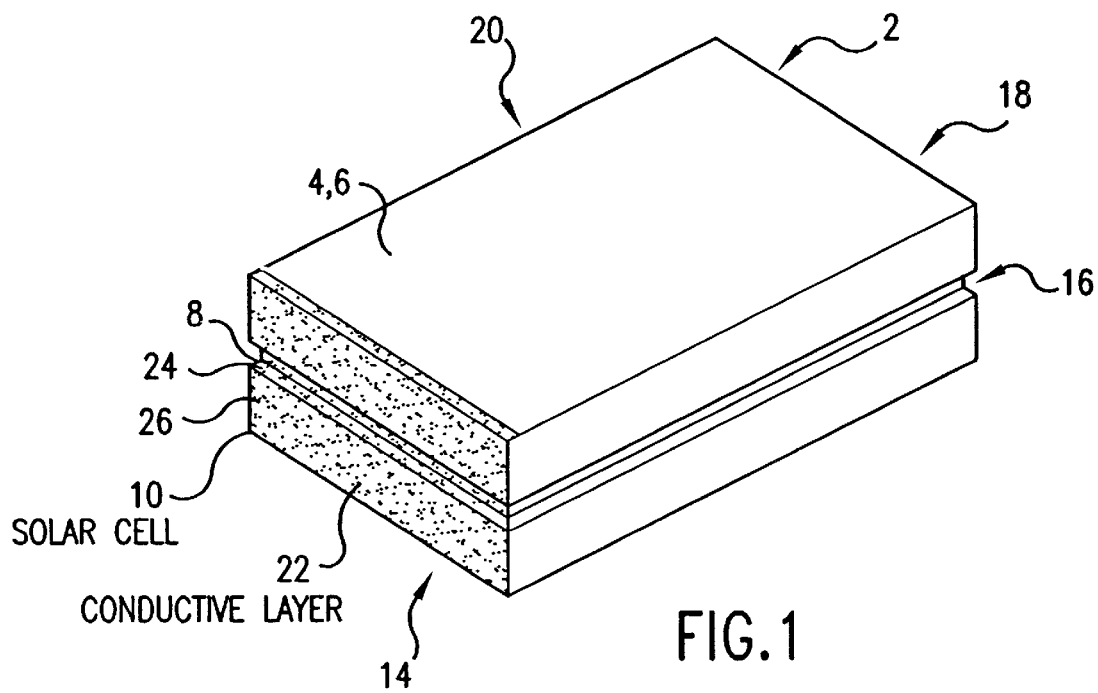
FIGS. 1 and 2 are perspective views of a solar cell assembly (SCA) according to the invention.
Figure 2:
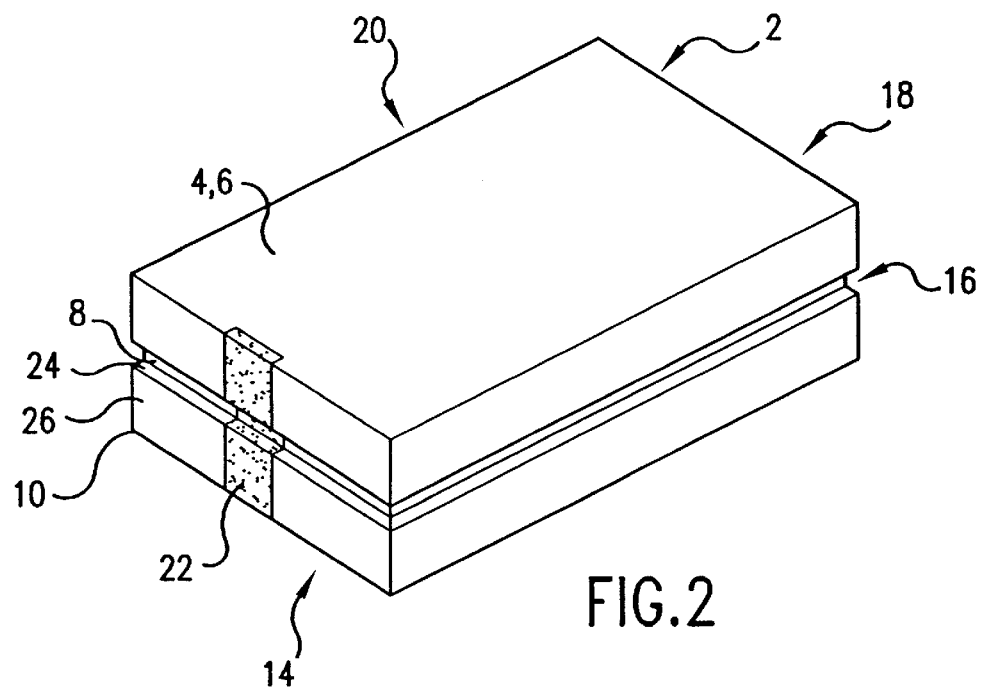
Figure 3:
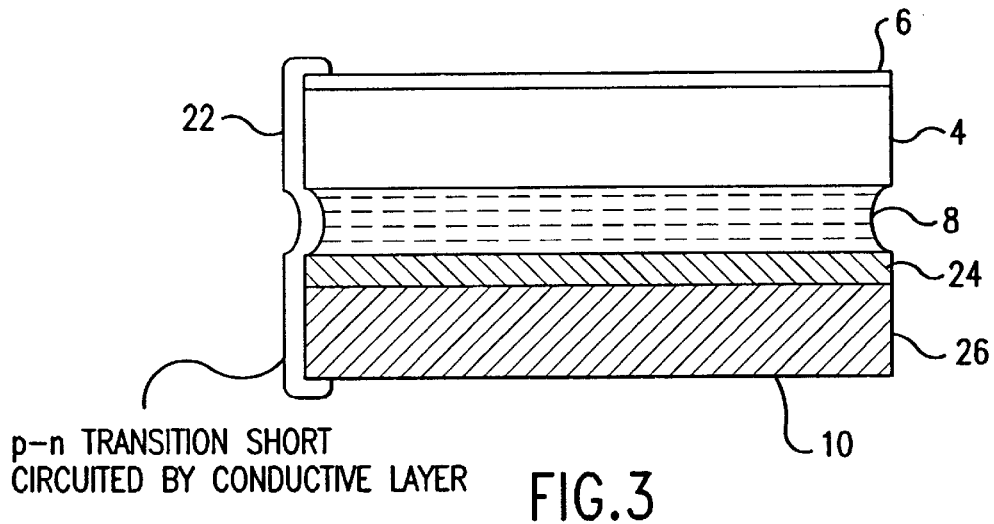
FIG. 3 is a side view of the solar cell assembly in FIGS. 1 and 2.

FIGS. 1, 2 and 3 show a solar cell assembly (SCA) 2 which consists of a cover glass 4 with a conductive vapor deposit 6, a bonding agent layer 8 and a solar cell 10 which has an n-layer 5 24 and a p-layer 26. Respective side faces 14, 16, 18, 20 of the SCA are formed by the sides of the cover glass 4 with the vapor deposit 6, the side of the bonding agent layer 8 and the sides of the p-layer 26 and of the n-layer 24 of the solar cell 10.

According to the invention, a conductive layer 22 is formed on at least one side face 14, 16, 18, 20 (FIG. 1) or a strip of at least one of the side faces (FIG. 2) of the SCA, and conductively connects the conductive vapor deposit 6 and the solar cell 10 with one another. In this case, the p-layer 26 with the n-layer 24 is short-circuited on the edge, as illustrated in the equivalent circuit diagram of FIG. 4. In FIG. 2, the conductive layer 22 is shown as a dark-colored strip on the side face 14 of the SCA, and in FIG. 1, it is shown as a dark coloring of the whole side face 14 of the SCA 2. In FIG. 3, the conductive layer 22 is shown in black. The conductive layer 22 illustrated in FIG. 3 may also be a conductive strip of material or a conductive polymer which is fixedly connected with the side face 14 of the SCA.

Figure 4:
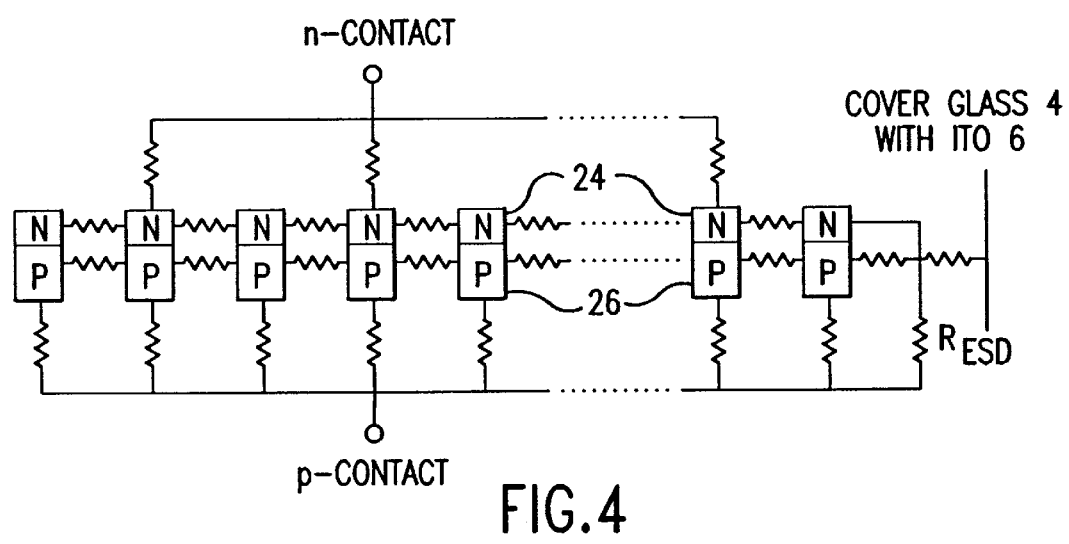
FIG. 4 is an equivalent circuit diagram of a solar cell with a conductive ESD layer.

As illustrated in the equivalent circuit diagram (FIG. 4), an additional parallel resistance is created by the mounting of a conductive layer by way of the N-P edge of the solar cell, which parallel resistance slightly changes the efficiency of the solar cell. If a solar cell is considered to be a parallel connection of any number of infinitesimally small individual current sources as shown in FIG. 4, the ESD resistance represents a load to only one such source at the edge of the solar cell. This has been confirmed by measurements of the forward resistance after sputtering of the connected layer.

The mounting of this conductive layer has the object of reaching a resistance $R_{ESD}$ of approximately 1 kohm to 10 kohm, which is sufficient to discharge the charge potentials, and still large enough so as not to negatively influence the efficiency of the solar cell.

The application of the ESD resistance and the selection of the materials is a function of the intended use of the SCA. Examples of uses in space operations will be explained in the following:

1. Sputtering of Atomic Gold Layers (Layer Thickness 5 nm to 30 nm)

A low-impedance layer can be applied to the cell edge. First preliminary tests by means of sputtering have demonstrated that a discharge resistance of 3 kohm could be generated in less than one minute. As the result, the discharge resistance of the solar cell changed from 496 ohm before sputtering to 485 ohm afterward. No change of the blocking resistance could be measured.

2. Vapor-Depositing of Silicium, Gold or ITO (Indium Titanium Oxide)

In addition to the sputtering, conductive layers can be vapor-deposited. The advantages correspond to those of the sputtering. Thin layers are achieved.

3. Gluing-on of Conductive Strips or Conductive Dyes/Bonding Agents

The costs of the process are further reduced if the conductive layer is generated by a conductive layer applied in a liquid state. Adherence can be achieved by priming the cell edge. In addition, the insulation of the N-P transition is improved. The low radiation stability of polymer compounds may be a disadvantage in orbit.

Since the coefficient of thermal expansion of the cover glass and of the solar cell itself are already precisely coordinated with one another, there is a very low risk that an applied conductive layer will tear as the result of thermal tensions. Special stress relief is therefore unnecessary.

In the process according to the invention, each cell is ESD-protected separately. Thus, only very high-impedance discharge resistances are required to ensure a sufficient ESD protection. If a charging current of $1 \cdot 10^{-9}$ A/cm$^2$ is assumed, an ESD resistance of 5 Mohm per cell would be sufficient to ensure a maximal cover glass charging of 0.1V. This corresponds to even the highest ESD requirements.

If an ESD resistance of 1 kohm applied during the manufacturing does not negatively influence the solar cell efficiency, and 5 Mohm are completely sufficient, this corresponds to a safety factor of 5,000. Therefore, all possible manufacturing tolerances and additional degradation effects are sufficiently covered. The process is therefore fault-tolerant.

ADVANTAGES OF THE INVENTION

A significant reduction of the costs of the manufacturing process.

Since each cell is separately ESD-protected, any need for generator-specific and customer-specific ESD construction and qualification is eliminated.

The ESD protection can be applied during SCA manufacturing within the automation line, without extending the manufacturing durations.

Conventional ITO-coated cover glasses can be used, therefore resulting in no additional cost.

This new ESD grounding concept requires no additional mass. (10 nm gold layer per cell is negligible).

The applied layer meets all space-operations-specific requirements, such as temperature stability, resistance to radiation and vibrations.

No costs for the generator manufacturing. The previous manufacturing process does not have to be changed. It will therefore be possible to equip all future solar generators with ESD protection.

The surface occupancy of the panel structures can be increased since, in contrast to previous ESD protection arrangements, a high-expenditure system of grounding conductors is no longer required.

Reliability: The ESD grounding process can be checked within very narrow limits by monitoring a few parameters. Possible problems are therefore limited to individual SCA's and not, as previously, to completely mounted solar generators.

The efficiency losses of this new ESD concept are therefore clearly below the previously customary 1–2%.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. An electrostatic discharge (ESD) protection arrangement for a solar cell assembly which includes a cover glass provided with a conductive vapor deposit, a solar cell comprising of an n-layer and a p-layer, and a bonding layer which bonds the cover class and solar cell, said arrangement comprising:

a conductive layer provided on at least one strip of a side face of the solar cell assembly which conductive layer connects the conductive vapor deposit on the cover glass and the solar cell and short-circuits the p-layer with the n-layer at respective edges thereof.

2. ESD protection arrangement according to claim 1, wherein an entire side face of the solar cell assembly is provided with the conductive layer.

3. ESD protection according to claim 2, wherein a plurality of side faces of the solar cell assembly are provided with the conductive layer.

4. ESD protection according to claim 1, wherein the conductive layer on the cover glass is a conductive vapor deposit which consists of indium tin oxide.

5. ESD protection according to claim 1, wherein the conductive layer situated on the side face of the solar cell assembly is a gold layer with a layer thickness of from 5 nm to 30 nm which is applied by means of sputtering.

6. ESD protection according to claim 1, wherein the conductive layer on the side face of the solar cell assembly comprises a material selected from the group consisting of indium tin oxide, gold and silicium, and is applied by vapor depositing.

7. ESD protection according to claim 1, wherein the conductive layer situated on the side face of the solar cell assembly comprises a conductive polymer.

* * * * *